United States Patent
Van Der Schoot et al.

(10) Patent No.: US 7,310,132 B2
(45) Date of Patent: Dec. 18, 2007

(54) LITHOGRAPHIC APPARATUS AND DEVICE MANUFACTURING METHOD

(75) Inventors: Harmen Klaas Van Der Schoot, Vught (NL); Erik Roelof Loopstra, Heeze (NL); Fransicus Mathijs Jacobs, Asten (NL); Godfried Katharina Hubertus Franciscus Geelen, Echt (NL)

(73) Assignee: ASML Netherlands B.V., Veldhoven (NL)

( * ) Notice: Subject to any disclaimer, the term of this patent is extended or adjusted under 35 U.S.C. 154(b) by 90 days.

(21) Appl. No.: 11/377,636

(22) Filed: Mar. 17, 2006

(65) Prior Publication Data

US 2007/0216881 A1  Sep. 20, 2007

(51) Int. Cl.
*G03B 27/58* (2006.01)

(52) U.S. Cl. .............................. 355/72; 355/53; 355/75

(58) Field of Classification Search .................. 355/53, 355/72, 75
See application file for complete search history.

(56) References Cited

U.S. PATENT DOCUMENTS

| | | | |
|---|---|---|---|
| 4,509,852 A | 4/1985 | Tabarelli et al. | |
| 7,098,991 B2 * | 8/2006 | Nagasaka et al. | 355/53 |
| 7,199,858 B2 * | 4/2007 | Lof et al. | 355/30 |
| 2006/0139614 A1 * | 6/2006 | Owa et al. | 355/72 |
| 2007/0127006 A1 * | 6/2007 | Shibazaki | 355/72 |

FOREIGN PATENT DOCUMENTS

| | | |
|---|---|---|
| EP | 1 420 298 A2 | 5/2004 |
| EP | 1 420 300 A3 | 5/2004 |
| EP | 1 420 298 A3 | 10/2005 |
| WO | 99/49504 | 9/1999 |

* cited by examiner

*Primary Examiner*—D. Rutledge
(74) *Attorney, Agent, or Firm*—Pillsbury Winthrop Shaw Pittman LLP

(57) ABSTRACT

A moveable member is provided which extends the top surface of a substrate table, in plan, beyond a bumper which protects the substrate table during collision. The moveable member may be retracted to a retracted position in which it no longer extends beyond the bumper. In this way it is possible to move two substrate tables together and to allow the retractable member to pass under a liquid supply system which normally provides liquid between the projection system and a substrate without turning off of the liquid supply system.

38 Claims, 6 Drawing Sheets

Fig. 2
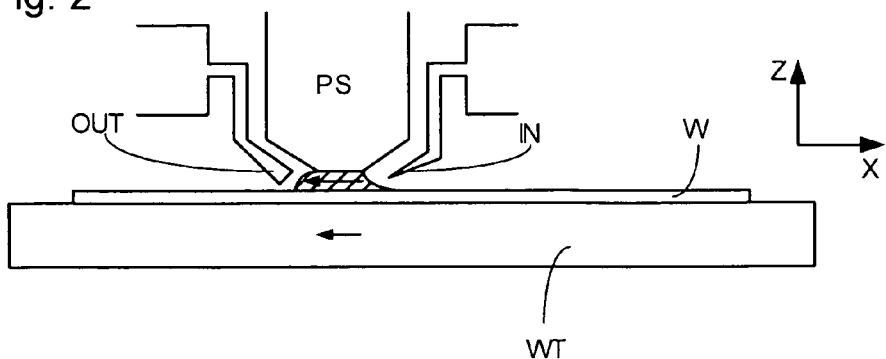
Fig. 3
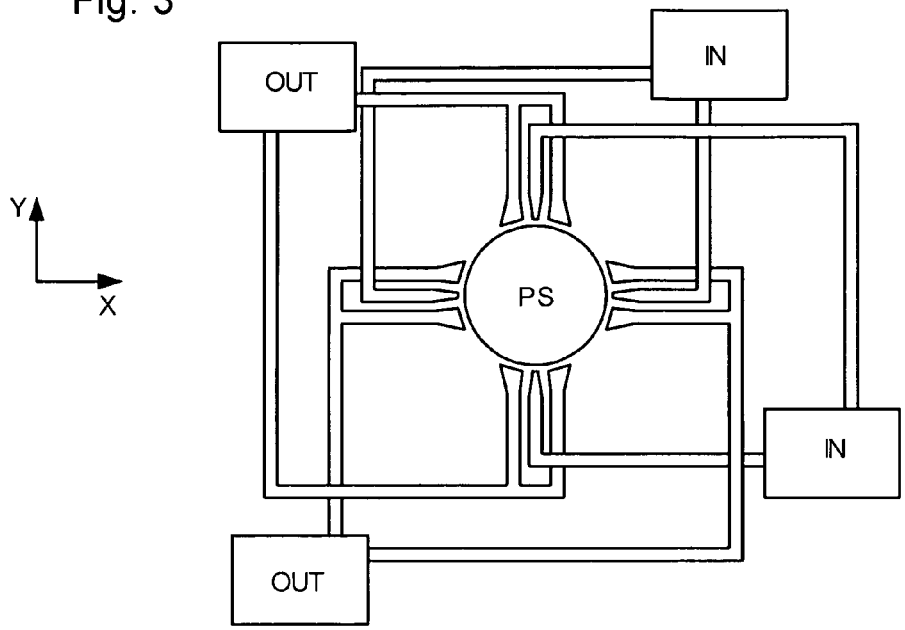
Fig. 4
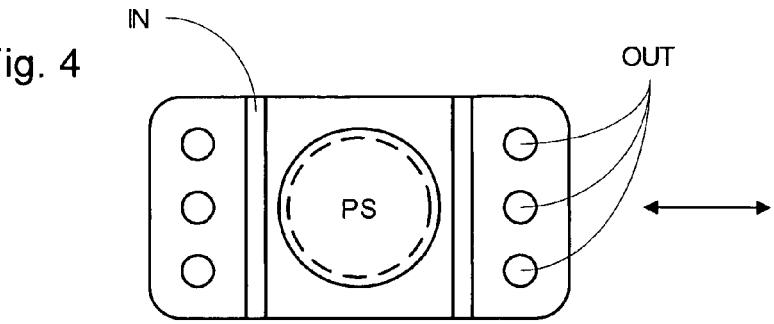
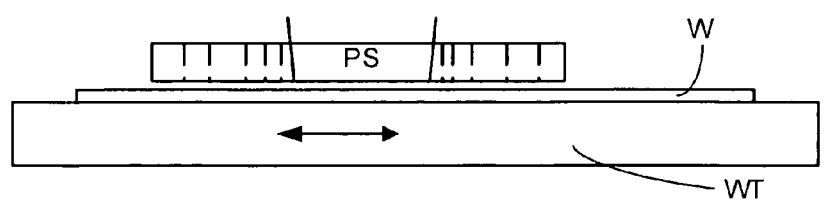

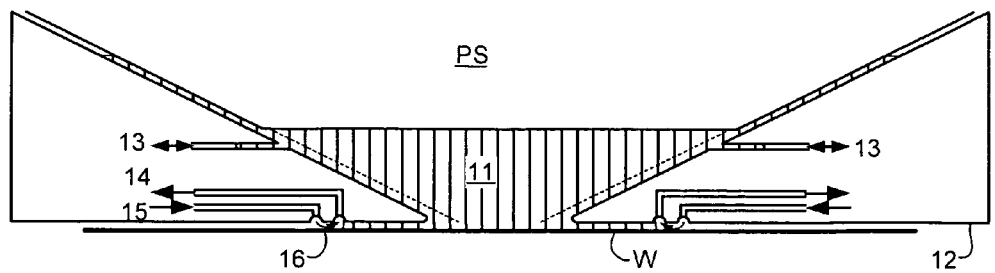
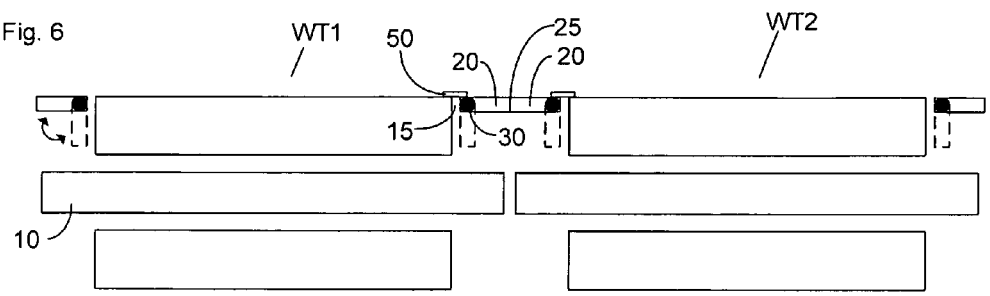
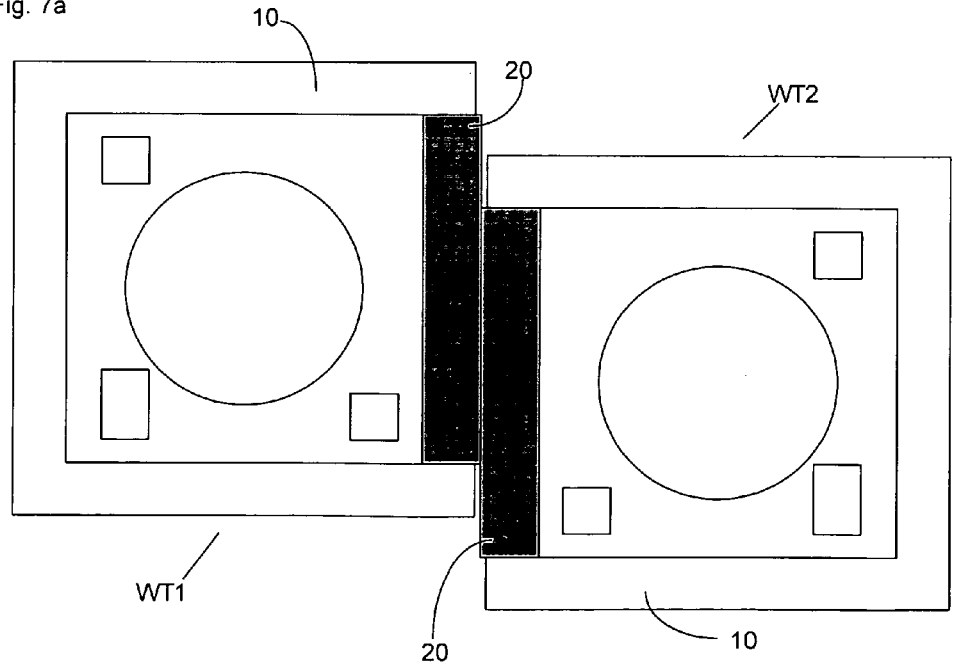

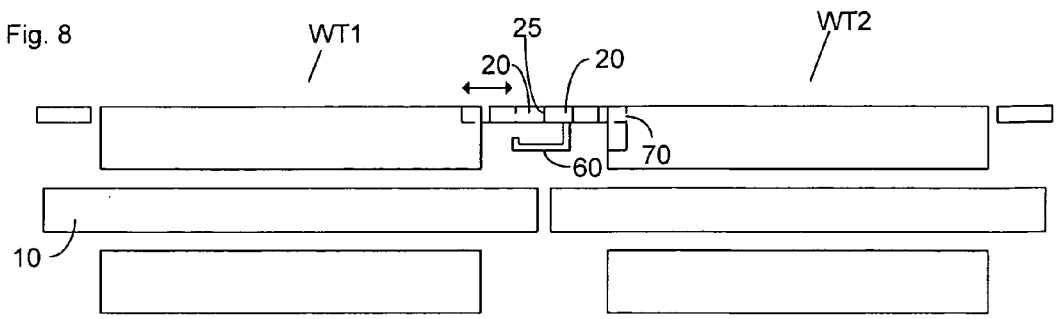
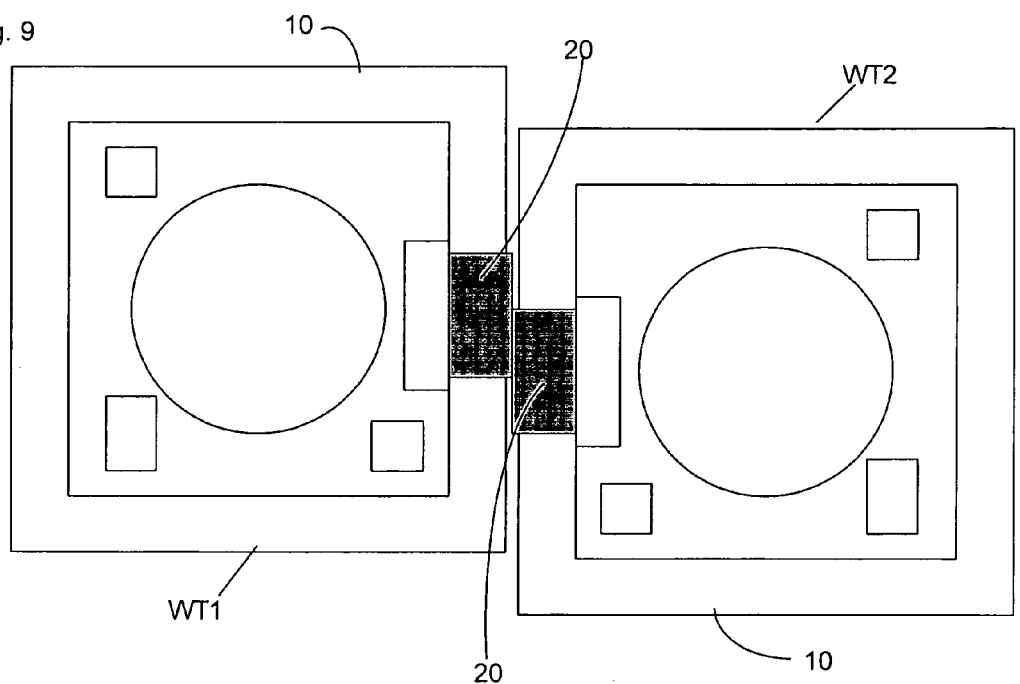
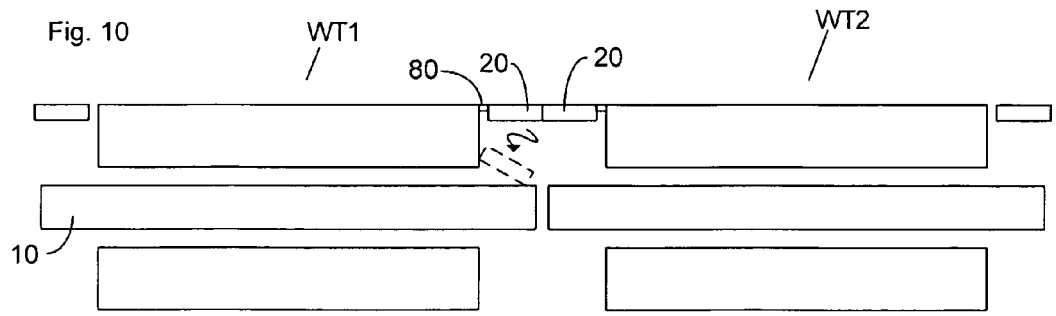

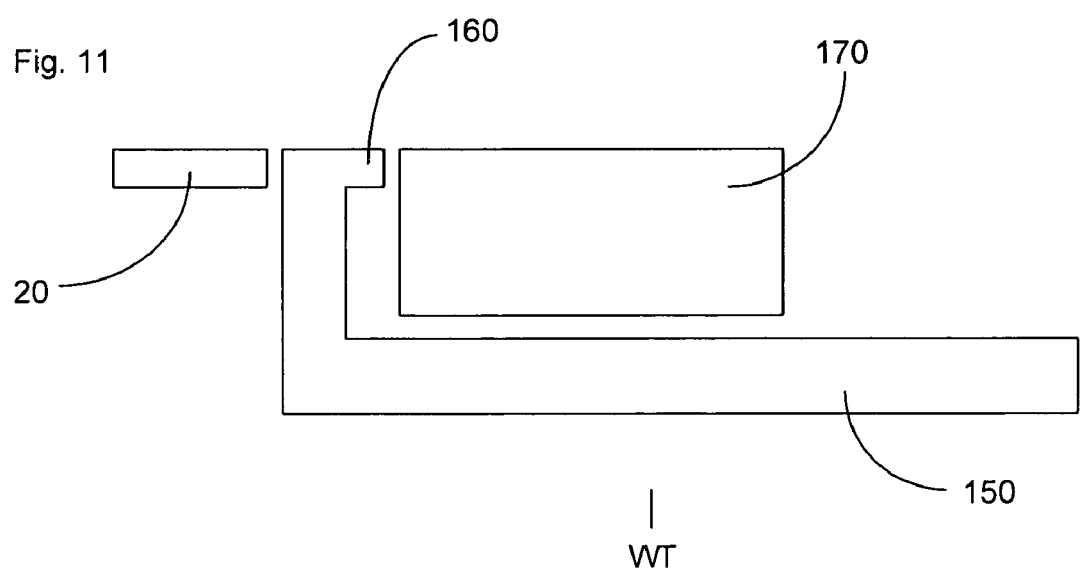

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such as system with a gas seal is disclosed in FIG. 5 and in EP-A-1,420,298 hereby incorporated in its entirety by reference.

In EP-A-1,420,300 hereby incorporated in its entirety by reference the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

In an apparatus in which two substrate tables or stages are provided in which each one carries a substrate, it may be difficult to swap one substrate table from underneath the projection system with another substrate table underneath the projection system. This is because if the liquid from the liquid supply system is removed prior to swapping the tables then drying stains can appear on the final element of the projection system. One solution which has been proposed is to provide a dummy substrate which is positionable under the projection system during swapping of substrate tables. In this way the liquid supply system can be kept on during swap and no drying stains can form. However, the positioning and attachment of the dummy substrate can be a time consuming process and thereby result in reduced throughput. Also there is a risk of contamination.

SUMMARY

It is desirable to provide an apparatus in which substrate tables can swap positions underneath the projection system of an immersion apparatus without the need to drain the liquid supply system of liquid.

According to an embodiment of the invention, there is provided a lithographic apparatus including: a substrate table for supporting a substrate, wherein the substrate table includes a moveable protrusion which, in a use position, exposes a top surface which is substantially in the same plane as a top surface of the substrate table and the substrate and presents, in plan, an outer edge of the substrate table, and which moveable protrusion is moveable relative to the substrate table, in use, to a position at which it does not form an outer edge of the substrate table.

According to an embodiment of the invention, there is provided a lithographic apparatus including: a liquid confinement system including a barrier member at least partly defining sidewalls of a space for the confinement therein of liquid, a bottom surface of the space being defined by a top surface of a substrate table and/or a substrate supported on the substrate table and/or another object supported on the substrate table; a first the substrate table and a second the substrate table wherein at least one of the substrate tables includes a moveable bridge configured to form at least part of the bottom surface of the space in the plane of the top surface of a substrate table and/or a substrate supported on the substrate table and/or another object supported on the substrate table; and the first and second substrate tables are positionable relative to each other such that the moveable bridge substantially extends between the substrate tables and can define at least part of the bottom surface.

According to an embodiment of the invention, there is provided a lithographic apparatus including: first and second tables each positionable under a projection system; a liquid supply system for providing a liquid between the projection system and one of the tables and/or an object on the one of the tables, wherein at least one of the first and second tables has a retractable bridge which, in a use position, has a top surface which is substantially in the same plane as a top surface of the first and second tables and which, in plan, protrudes at least as far as any other part of the table such that the first and second tables may be moved together under the projection system with surfaces close enough together such that the leaking of liquid from the liquid supply system between the tables is substantially prevented.

According to another embodiment of the present invention, there is provided a lithographic apparatus including: a substrate table for supporting a substrate; a protection system which defines a protection zone around the substrate table into which at least one other object cannot enter; wherein the substrate table includes a moveable protrusion which, in a use position, exposes a top surface which is substantially in the same plane as a top surface of the substrate table and the substrate and presents, in plan, an outer edge which projects out of the protection zone, and which moveable protrusion is moveable relative to the substrate table, in use, to a position at which it does not project out of the protection zone.

According to another embodiment of the invention, there is provided a device manufacturing method, including: providing a liquid to a space through with a patterned beam passes, a first substrate table and/or an object supported by the first substrate table forming a part of a boundary of the space; sealing the liquid in the space, the seal acting between the substrate and/or the object, and another object; providing a second substrate table, at least one of the first and second substrate tables having a moveable bridge portion deployed in a use position and moving the first and/or second substrate table(s) such that the bridge portion extends between the substrate tables; moving the first and second substrate table(s) together under the space such that first the bridge portion forms a part of the boundary of the space and then the second substrate table and/or an object supported by the second substrate table forms a part of the boundary; and projecting a patterned beam of radiation through the liquid onto the substrate supported by the second substrate table.

In an embodiment, there is provided a lithographic apparatus including a radiation system configured to condition a beam of radiation; a patterning device support configured to support a patterning device, the patterning device configured to pattern the beam of radiation; a substrate table configured to support a substrate; a projection system configured to project the patterned beam of radiation onto the substrate; wherein the substrate table includes a support surface that supports the substrate and a moveable edge portion, the moveable edge portion being arranged on an outer edge of the substrate table and moveable between a first position, in which, a top surface of the moveable edge portion is substantially in a same plane as the support surface of the substrate table, and a second position in which the top surface of the moveable edge portion is substantially perpendicular to the support surface.

In an embodiment, there is provided a lithographic apparatus including a substrate table configured to support a substrate, the substrate table including a main portion and a moveable edge portion, wherein when the edge portion is in a first position, the edge portion has a top surface which is substantially in a same plane as a top surface of the main portion, and presents, in plan, an outer edge of the substrate table, wherein the moveable edge portion is moveable relative to the substrate table main portion to a second position at which the moveable edge portion does not form an outer edge of the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a conventional liquid supply system used in a lithographic projection apparatus in accordance with an embodiment of the present invention;

FIG. 4 depicts a conventional liquid supply system used in a lithographic projection apparatus in accordance with an embodiment of the present invention;

FIG. 5 depicts, in cross-section, a liquid supply system in accordance with an embodiment of the present invention;

FIG. 6 depicts, in cross-section two substrate tables according to an embodiment of the present invention;

FIG. 7a depicts the substrate tables of FIG. 6 in plan;

FIG. 7b depicts, in plan, two substrate tables in accordance with an embodiment of the present invention with a different protection system to that of FIG. 7a;

FIG. 8 illustrates, in cross-section, two substrate tables according to an embodiment of the present invention;

FIG. 9 depicts the substrate tables of FIG. 8 in plan;

FIG. 10 depicts, in cross-section, a substrate table in accordance with an embodiment of the present invention; and FIG. 11 depicts, in cross-section, an arrangement of a substrate table which may be used in any embodiment.

DETAILED DESCRIPTION

Figure 1:
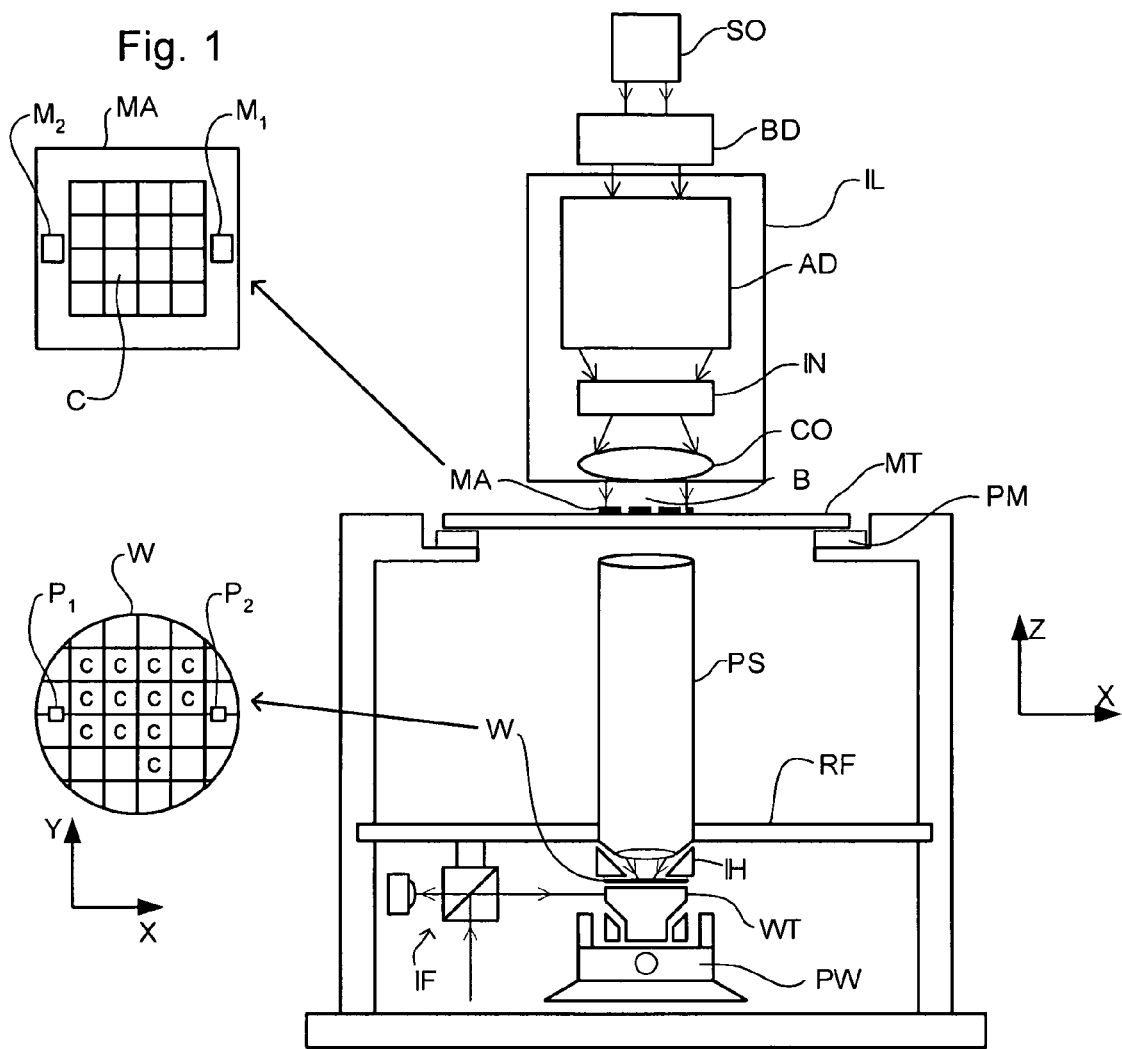
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation), a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W. The apparatus also includes a reference frame RF.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The present invention is particularly suited to use with localized area type liquid supply systems such as those illustrated in FIGS. 2-5. There may be other liquid supply systems which are suitable. However, those types which provide liquid to only a localized area of the top surface of the substrate table and/or substrate and/or other object supported by the substrate table are most suited to the present invention. The type which covers the whole of the top surface of the substrate with liquid at one moment is also relevant.

A particular difficulty with immersion lithography is the swapping of substrates underneath the projection system PS. One method of doing this is to remove liquid from the liquid supply system and then to re-position a fresh substrate (and substrate table or a fresh substrate with the previous substrate table) under the projection system PS before reactivating the liquid supply system. However, during removal of all of the liquid from the liquid supply system, drying stains can appear on the final element of the projection system.

In order to address this it has been proposed to place a dummy substrate under the projection system PS during substrate swap so that the liquid supply system can continue to be full of liquid during substrate swap. In this method a dummy substrate might be supported by the substrate table and after the substrate of that substrate table has been imaged, the substrate table is moved such that the dummy substrate is positioned under the projection system PS and the dummy substrate is then somehow attached to the projection system PS. The substrate table can then be moved away and a new substrate loaded or a different substrate table with a new substrate can be moved into position under the projection system PS. The dummy substrate is then lowered onto the substrate table and then the substrate table moved such that the substrate is positioned under the projection system PS. In this way it is not necessary to empty the liquid supply system during substrate swap. However, this system requires a certain amount of time to affect substrate swap.

An embodiment of the present invention uses the system where substrate swap is achieved by positioning a second substrate table next to the substrate table presently in use and ensuring that the top surfaces of both substrate tables are substantially in the same plane. This is so that the liquid supply system can efficiently maintain the liquid in the desired space without leaking. If the two top surfaces of the substrate tables are close enough together, it is possible to move the substrate tables together under the projection system PS without leaking of liquid from the space through any gap which might be present between the two top surfaces of the substrate tables. An evacuation system or a drain may be provided between the substrate tables such that any water which does leak between the gap between the top surfaces of the substrate tables can be collected. In this way, throughput can be increased because this method of substrate swap is faster than the other two methods described above.

In a lithographic apparatus it is desirable to protect the system from any damage in the case of a control system crash or power failure. For this reason substrate tables WT are provided with a protection device (e.g. a bumper) which provides a protection zone which surrounds the substrate table and which is arranged in size and in shape to protect the substrate table in the event of a crash by not allowing other objects to enter the protection zone (e.g. by providing a surface which will take any impact during a collision of the substrate table with another object (for example another substrate table)). One example is a bumper 10 as illustrated in, for example, FIGS. 6, 7a, 8-10, but other arrangements are equally applicable such as that illustrated in FIG. 7b. The protection zone can be regarded as the footprint of the substrate table if the protection device or system is in the form of a bumper (e.g. the protection zone is an area from which other objects are excluded).

An embodiment of the present invention is directed to a substrate table which is both protected by a bumper and which has a top surface which can be extended beyond the bumper such that swap of the substrate underneath the projection system PS can occur by concurrent moving of two substrate tables under the projection system without turning off of the liquid supply system and without use of a dummy substrate. All of this is achieved while still maintaining the safety feature of a fully functioning bumper.

An embodiment of the present invention is illustrated in FIG. 6. FIG. 6 illustrates, in cross-section, a first substrate table WT1 and a second substrate table WT2. The substrate tables WT1, WT2 have been brought together prior to swap of one substrate table WT2 for another substrate table WT1 under the projection system PS. Thus imaging of the substrate supported by the first substrate table WT1 has finished and it is desired to bring a fresh substrate, supported by the second substrate table WT2, under the projection system. The first stage is for the second substrate table WT2 to be brought along side the first substrate table WT1. This may involve moving both the first substrate table as well as the second substrate table or only one of the substrate tables. Each substrate table is protected by a bumper 10 which surrounds the substrate table, in plan, and is sized and shaped to ensure that it is the bumper 10 which will receive the first impact of any collision of a substrate table with any other object.

In an embodiment of the present invention, a member 20 is provided which extends beyond the bumper 10 and any other part of the substrate table, in plan, and extends the top surface of the substrate table WT1, WT2 such that the top surfaces of each of the substrate tables can be brought close enough together so that when the substrate tables WT1, WT2 are moved together at the same time under the projection system PS, without turning off of the liquid supply system, substantially no liquid leaks between the gap 25 between the top surfaces of the substrate tables WT1, WT2 which will be present between the members 20.

Liquid supply systems of the localized area type generally rely on the top surface of the substrate table and/or substrate and/or other object supported by the substrate table to provide a boundary of a space to which liquid is provided. For example, in the liquid supply system of FIG. 5, a seal 16 is provided between the substrate (and substrate table or other object) and a barrier member 12. Thus, a space 11 is defined between the surfaces of the barrier member 12 and the top surface of the substrate W in which liquid is contained. Thus, in an embodiment of the present invention, at least a part of the boundary of the space 11 is provided by the top surface of the member 20 during swapping of one substrate table WT1 for another substrate table WT2 under the projection system PL. If the gap 25 between the two members 20 is small enough, and the substrate tables WT1, WT2 are moved fast enough, substantially no liquid will leak between the gap 25 between the two members 20. In order to get the gap between the two members 20 small enough, the members 20 extend, in a use position described below, in plan, beyond the bumper 10 such that, in plan, as is illustrated in FIG. 7a, the members 20 form an outer edge of the overall outer profile of their respective substrate table WT.

In order to maintain the safety during crash of the substrate tables WT1, WT2 the members 20 are designed to be moveable such that they can either be actively or passively moved out of the way in the situation of a crash resulting in impact (or the possibility of impact) of the substrate table WT so that the bumper can perform its function of absorbing energy of the impact. The members 20 may be moveable anyway and three examples are given, but the invention is not limited to these examples.

The member 20 of the embodiment of FIG. 6 will now be described in more detail. These features are equally applicable to the other embodiments. The members 20 can be seen as protrusions or as bridge members or as edge portion. In the embodiment of FIG. 6 these members 20 are hinged 30 along a longitudinal edge of the top surface of the main portion of the substrate table WT1. In FIG. 6, the main portion of the substrate table WT1 is adapted to support a substrate. In a use or first position the member 20 projects such that its top surface is in substantially in the same plane as the top surface of the main portion of the substrate table WT1 and/or the substrate W which is supported by that substrate table. In this position the member projects beyond the rest of the substrate table to define an edge of the outer profile, in plan, of the substrate table WT1.

In a retracted position, illustrated in dashed lines in FIG. 6, the member 20 does not form, in plan, an other edge of the profile of the substrate table WT1. In this position it is safe for the substrate table WT1 to collide with another object because the substrate table WT1 will be protected by the bumper 10 which forms, in plan, the outer edge of the substrate table WT1.

An actuator (e.g. of the active type) may be provided to move the member 20 between the use position and the retracted position though this is not necessarily the case. If an actuator is provided, a sensing system can also be provided which senses the proximity of another object using a detector and the likelihood of a crash. If the sensing system computes that a crash is likely to happen, the member 20 can be moved to the retract position (or maintained in the retracted position). During use the member 20 will usually be maintained in the use position though this is not necessarily the case. The actuator may be biased such that on power failure the member 20 automatically moves to the retracted position. Alternatively, an arrangement can be used in which the member 20 is held in the use position during supply of power to the substrate table WT1 but on interruption of that supply it returns to the retracted position. This could for example be arranged for with use of a solanoid. In this embodiment a sensor could also be provided to cut the power to the solanoid on detection of a likely crash situation. The detector of the controller could take any form for example, the detector could be an ultrasonic detector, an optical detector or could even be coupled to the positional detector and/or controller of the substrate table WT1. The actuator may be an electromagnetic actuator or a spring actuator.

A sticker 50 is illustrated as being provided between the inner most edge of the member 20 and the outer most edge of the substrate table WT1. This sticker is adhesive on one side and is manufactured to be relatively thin. The sticker bridges the gap 15 between the inner edge of the member 20 and the outer edge of the substrate table WT1 thereby to prevent leaking of liquid from the space into that gap 15 during substrate swap. The sticker is adhered such that if desired the member 20 can be moved or move from the use position to the retracted position without hindrance by the sticker. If a sticker is used, after each time the member 20 is moved to the retracted position it may be desirable to re-adhere the sticker or provide a new sticker. The member 20 could also be provided with a inwardly extending projection (i.e. which extends towards the (centre of the) substrate table) which takes the place of the sticker which would not be adhered to the top surface of the substrate table WT1 but which would perform a similar function of bridging the gap 15 between the outer edge of the top surface of the substrate table WT1 and the inner edge of the top surface of the member 20.

The members 20 have been illustrated as extending along the whole of a length of one side of the substrate table. This is not necessarily the case and the members 20 could extend along only a part of the substrate table, for example they could only be as wide as the space 11, in plan. Indeed, in FIG. 6 a moveable member 20 is illustrated on each of two opposite sides of a substrate table. This is not necessarily the case and each substrate table may be provided with one or more moveable members 20 on one or more edges of the substrate table WT1. Indeed, a pair of substrate tables WT1, WT2 could only be provided with one moveable member 20 between them. In this case it would be desirable for the moveable member 20, in the use position, to extend further and to form a bridge between the top surface of the substrate table WT1 and the top surface of the second substrate table WT2 by itself.

The bumper 10 has been described as being a physical projection which completely surrounds the substrate table WT1. Clearly the bumper could be formed in a different way and it does not necessarily need to extend continuously around the substrate table WT and could be discontinuous. However, the principals of the embodiment of the invention remain the same in such a variant and the term bumper and the edge of the bumper should be interpreted as meaning the effective protection zone (i.e. the outer edge of the area from which the bumper is effective to exclude other objects not attached to the substrate table) provided by an impact absorber whatever its form which is for protecting the substrate table WT1.

As the skilled person will appreciate, the bumper 10 may take other forms. When the bumper 10 is described in this application its meaning should be extended to other embodiments of a bumper which may not extend continually all around the substrate table but which form an effective zone protecting the substrate table. For example, the bumper 10 rather than being made solid could include a series of outward thin projections closely spaced and each extending to the outer edge of the boundary 10 illustrated in FIG. 7*a*. In such an embodiment the effective protection provided by the thin projections would extend to the outer edge of the bumper 10 as illustrated in FIG. 7*a*. Such embodiments are to be included in the description of embodiments of the invention and are to be assumed to also extend to the perimeter of the barrier 10 illustrated in FIG. 7*a* the degree of extension corresponding to the degree of the protected zone.

Figure 7B:
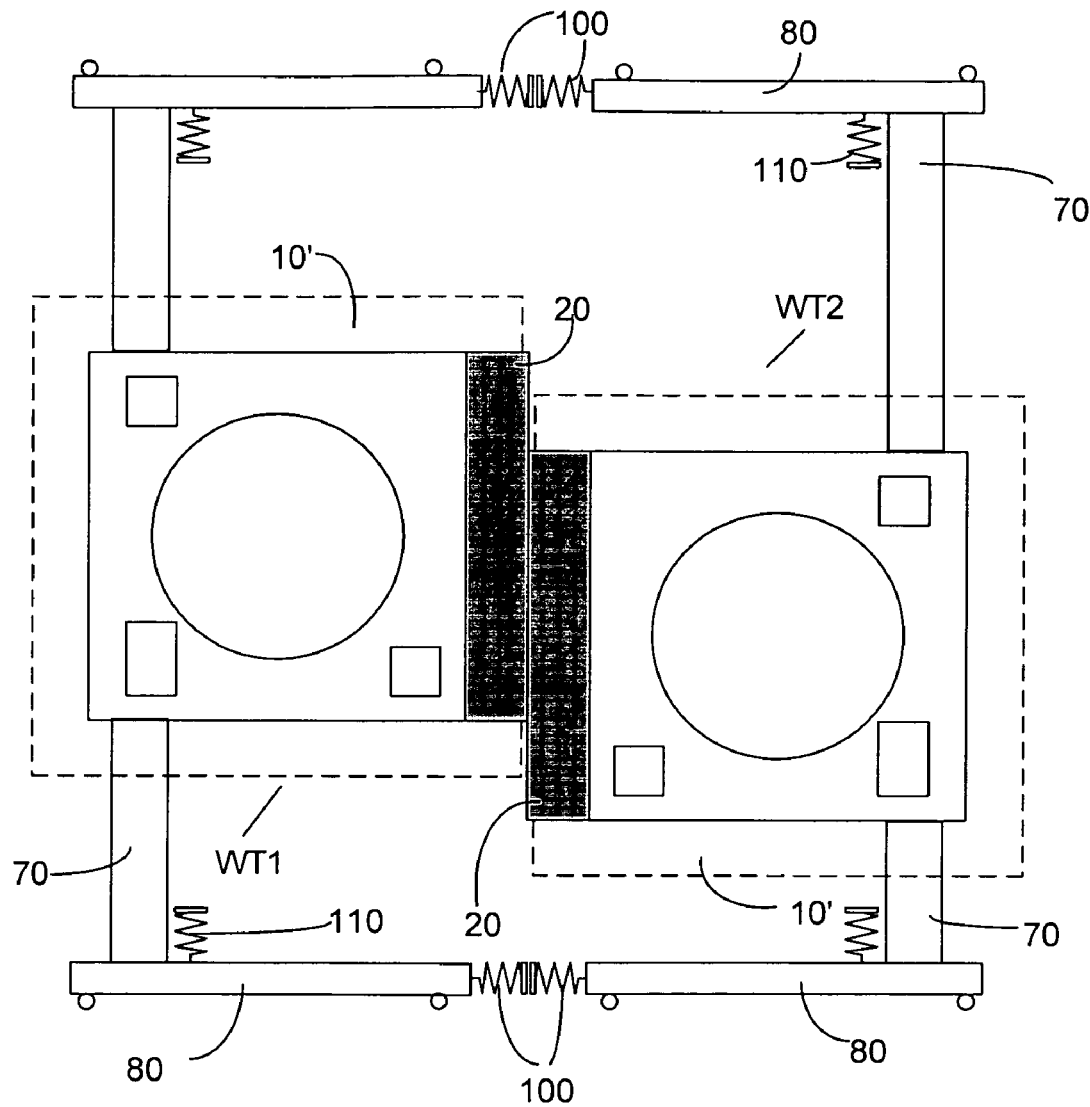

FIG. 7*b* is the same as FIG. 7*a* except that instead of having a barrier 10 the substrate tables are provided with a different protection system which provides a protection zone 10' which has a footprint similar to that of the barrier 10 of the embodiment illustrated in FIG. 7*a*. The protection zone 10' is arranged such that other objects, and in particular another substrate table WT, cannot enter that protection zone 10'.

In the embodiment illustrated in FIG. 7*b*, the substrate tables WT are each positioned in the x y plane by separate actuators. The substrate tables WT are attached to members 70 which extend in the y direction. The substrate table WT can move up and down the members 70 thereby to position themselves in the y direction. The members 70 are attached to at least one x positioning device 80 which can move the member 70 in the x direction. Both substrate tables are provided with such a positioning device 70, 80.

The protection system is attached to the x positioning device 80 though this may not be the case and the protection system may be attached to a combination of both the substrate table the member 70 and the x positioning means 80. The protection system includes a series of bumpers or springs 100, 110. The bumpers or springs are positioned and/or dimensioned such that the bumpers or springs of the protection system 100, 110 interact with each other before the substrate tables enter each others protection zone 10' or the barriers 110 interact with the substrate tables themselves before the substrate tables come near to a collision with objects at the end of the elements 70.

The same principles as described in relation to FIGS. 6 and 7*a* apply in the embodiment illustrated in FIG. 7*b* in relation to the member 20 except that the bumper 10 is replaced by a projection zone 10'. The following embodiments are also as applicable to the embodiment of FIG. 7*b* as to the embodiment of FIGS. 6 and 7*a*.

It will be appreciated that an embodiment of the invention is equally applicable to the situation where only one substrate table is provided with a member 20 or protection system.

The member 20 is moveable relative to its respective substrate table. In the embodiment of FIG. 6 this is by rotation, in the embodiment of FIG. 8 this is by translation and in the embodiment of FIG. 10 this may be by rotation and/or translation and indeed the member may become completely detached from the substrate table. In other words, the member 20 is sacrificial in the embodiment of FIG. 10.

FIGS. 8 and 9 illustrate an embodiment of the present invention which is the same as the embodiment of FIG. 6 except as illustrated below. In the embodiment of FIG. 8, the moveable members 20 are translatable such that in a use position they extend, in plan, so that they form an outer edge of the boundary of the substrate table and in a retracted position, which may be fully retracted or only partially retracted into the remainder of the substrate table, they do not form part of the outer boundary of the substrate table.

The actuation of the moveable members of the embodiment of FIG. 8 may be the same or similar to that of the embodiment of FIG. 6. Stickers 50 may also be used between the gap between the moveable member 20 and the top surface of the substrate table WT. Furthermore, below are described in relation to the embodiment of FIG. 8, methods by which any liquid which does leak between the gap 25 between the two substrate tables can be contained. These are equally applicable to all other embodiments.

One method is to provide a liquid removal device at the outer most edge of one or both of the moveable members 20 in their use positions such as a low pressure source to suck any liquid which does find its way into the gap 25 away. An alternative embodiment, which is illustrated, is to provide a drain 60 attached to one of the moveable members 20 and underneath the moveable member 20 to catch any liquid which does find its way through the gap 25 between the moveable members 20. The drain 60 may be in the form of a J, as illustrated, and extends underneath the gap between the two moveable members 20 to catch any drips of liquid from the gap and contain such liquid and/or transport it away. Any liquid in the drain 60 may be removed by conventional means such as, for example, a low pressure source. The drain 60 may also be attached to other components and not to the moveable member 20. For instance it may be attached to part of the long stroke actuator or the substrate table.

As is illustrated in FIG. 9, the moveable members do not extend along the whole length of one edge of the substrate table and during moving together of the two substrate tables it is not necessary that the relative position of the substrate tables is maintained constant. In the embodiment of FIG. 8, a housing 70 is desirable for the moveable member to move into when it is moved to its retracted position. The separation of the two members is of the order of about 500 to 0 µm or about 500 to 5 µm. A target is about 100 µm, but they may also be touching.

In one embodiment, one of the members 20 may in fact be fixed though in this embodiment it does not extend beyond the bumper 10 and does not form part of the outer edge of the profile of the substrate table, in plan.

FIG. 10 illustrates an embodiment which is the same as the embodiment of FIG. 6 and/or the embodiment of FIG. 8 except as described below. In the embodiment of FIG. 10, the moveable member 20 is a sacrificial moveable member. In this embodiment, the moveable member is attached to the substrate table WT by a weakness 80, for example a thin bit of material or by a material which is not as strong as the member 20 and/or the substrate table top surface. Alternatively the weakness may actually be a physical separation, the moveable member being held to the substrate table WT by a press fitting in which a male protruding part of the moveable member or substrate table is held in a female receptor feature of the other of the moveable member and substrate table. This press fitting holds the two members together but can also be broken by low force. Thus, during a crash although the sacrificial member 20 protrudes beyond the effective zone of the bumper 10 and may receive impact before the bumper 10 this will not result in large scale damage of the substrate table WT or the object into which it crashes because the member 20 will be broken off with a low force at the weakness 80 or deflected so that the majority of the energy of the impact will still be absorbed by the bumper 10. The weakness 80 may for example be a weak coupling e.g. magnetic, either using permanent magnets or an electro magnet, may be a weak adhesive or may be a thinning of the thickness of the member 20 by which the member is attached to the substrate table. Thus, on impact the member 20 would break at the thin area.

A retainer can be provided for retaining the sacrificial moveable member after it has been broken off to prevent it from falling into a position where damage could be done. The retainer could be constructed and arranged to direct the broken off part to a safe area (e.g. away from the projection system) or to keep it attached to the substrate table. The retainer could for example be a mechanical retainer, for example a spring, a flexible tie etc. or could be magnetic (if the moveable member is magnetic) to attract the moveable member after it breaks off.

FIG. 11 illustrates a different type of substrate table WT which may be used with any of the above mentioned embodiments. The substrate table WT includes a long stroke module 150 and a short stroke module 170. The long stroke module 150 is used for course positioning and the short stroke module 170 (which is supported by the long stroke module 150 and moves relative to the long stroke module 150) is for fine positioning. The substrate is held on the short stroke module 170. In the embodiment illustrated in FIG. 11 the moveable member 20 is attached to the long stroke module 150. A protrusion 160 which may also be a moveable member is provided on the long stroke module 150 to ensure that a narrow gap between the short stroke module 100 and the long stroke module 150 can be achieved during substrate swap. Other arrangements are also possible including providing the moveable member 20 on the short stroke module 100.

There are some alternatives to the use of the retractable member 20 described above. For instance, it is possible to retract the bumper itself such that the top surfaces of the substrate tables can be maneuvered to be close to each other without the need for the retractable member 20. Alternatively, the bumpers can be arranged to have certain positions at which two substrate tables may be maneuvered such that their top surfaces are close enough together. One simple embodiment would be a slot and key arrangement whereby one bumper is provided with a slot and another bumper provided with a key which fits into the slot. This allows, in a certain relative position, the key of one bumper to be inserted into the slot of another bumper and such that the top surfaces of the substrate tables WT can be brought closer to each other. More elaborate versions of the slot and key embodiment are also possible, for example those involving a pin travelling through a labyrinth slot such that more than one specific translation or relative movement of the two substrate tables is necessary in order for the top surfaces of the substrate tables to be brought close enough together. For example, a slot may present a channel which has two 90° bends such that the channel is comprised of three parts, one part leading towards the bulk of the substrate table, the next part running parallel to an edge of the substrate table and the next part again running towards the bulk of the substrate table. In this way the likelihood of the required relative movements of the substrate tables being performed accidentally and thereby resulting in a crash are significantly reduced over the simple slot and key mechanism. The labyrinth type of solution could also involve the necessity for movement of one or both of the bumpers 10 in the z direction (i.e. in the same direction as the optical axis). A further possibility is to arrange for the bumpers to include a slot/key which run parallel to the edge of a substrate table. This means that when a direct collision relative movement between the substrate tables is made the two bumpers will interact to prevent collision of the delicate parts of the substrate table. However, the two top surfaces of the substrate table can be brought close together by maneuvering the substrate tables such that the slot of one of the barrier members is entered by the key (projection) on the bumper of the other substrate table and that projection is then slid into the slot thereby to bring the two top surfaces of the substrate tables together. This system can be further refined by providing a cover over the slot. The cover is only removed by an actuator when the two substrate tables are close to each other and at low velocity. Thus, the fail safe position is with the cover over the slot so as to ensure that any high energy collision is between bumpers (e.g. the projection hitting the cover) and the cover could be biased to the closed position. During substrate swap, the cover can be removed so that the projection can be inserted into the slot. A final possibility is to maintain the bumper 10 stationary to the base of the substrate table (see FIG. 6) but to move the top part of the substrate table relative to the bumper 10 and the base of the substrate table such that the top surfaces of the substrate tables can meet. However, any of the above described mechanisms suffer from the draw back that they are not totally fail safe.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a substrate table configured to support a substrate, said substrate table including a main portion and a moveable edge portion, wherein when the edge portion is in a first position, said edge portion has a top surface which is substantially in a same plane as a top surface of said main portion, and presents, in plan, an outer edge of said substrate table,
   wherein said moveable edge portion is moveable relative to the substrate table main portion to a second position at which said moveable edge portion does not form an outer edge of said substrate table.

2. The lithographic apparatus of claim 1, wherein said moveable edge portion is hingeably rotatable about an hinge from said first position to a retracted position in which said moveable edge portion does not form, in plan, an outer edge of said substrate table.

3. The lithographic apparatus of claim 1, wherein said moveable edge portion is slidably attached to said substrate table and translatable from said first position to a retracted position in which said moveable edge portion does not form, in plan, an outer edge of said substrate table.

4. The lithographic apparatus of claim 1, wherein said moveable edge portion is attached to said substrate table via a sacrificial weakness which is breakable at relatively low force.

5. The lithographic apparatus of claim 1, wherein said moveable edge portion is passive and is moveable by application of externally applied forces.

6. The lithographic apparatus of claim 1, wherein said substrate table further comprises an actuator configured to move said moveable edge portion from said first position to a retracted position in which said moveable edge portion does not form, in plan, an outer edge of said substrate table.

7. The lithographic apparatus of claim 6, wherein said actuator is an electromagnetic or a spring actuator.

8. The lithographic apparatus of claim 6, further comprising a detector configured to (a) detect imminent collision of said moveable edge portion with an object and (b) send control signals to said actuator to move said edge portion to said retracted position.

9. The lithographic apparatus of claim 1, wherein a liquid proof sticker is positioned over a gap between said top surface of said moveable edge portion and said top surface of said substrate table.

10. The lithographic apparatus of claim 1, wherein a liquid remover is provided on said substrate table to remove any liquid which drips off an end of said edge portion distal from said substrate table.

11. The lithographic apparatus of claim 1, wherein a liquid remover is provided at an end of said moveable edge portion distal from said substrate table.

12. The lithographic apparatus of claim 10, wherein said liquid remover includes a drain positioned underneath an outer edge of the top surface of said moveable edge portion.

13. The lithographic apparatus of claim 1, further comprising an additional substrate table configured to support a substrate, said additional substrate table including a main portion and a moveable edge portion, wherein when the edge portion of said additional substrate table is in a first position, said edge portion of said additional substrate table has a top surface which is substantially in the same plane as a top surface of said additional substrate table main portion and presents, in plan, an outer edge of said additional substrate table, the moveable edge portion of said additional substrate table being moveable relative to the additional substrate table to a second position at which said moveable edge portion does not form an outer edge of said additional substrate table.

14. The lithographic apparatus of claim 1, wherein said substrate table has a protruding bumper which at least partly surrounds said substrate table and is configured to absorb at least some of the energy of impact in collision.

15. The lithographic apparatus of claim 1, wherein the substrate table includes a short stroke module and a long stroke module and wherein said moveable edge portion is attached to said long stroke module.

16. The lithographic apparatus of claim 1, wherein said edge portion is connected to said main portion.

17. A lithographic apparatus comprising:
   a liquid confinement system comprising a barrier member at least partly defining sidewalls of a space for confinement therein of liquid, a bottom surface of said space being defined by a top surface of a first or second substrate table and/or a substrate supported on said first or second substrate table and/or another object supported on said first or second substrate table,
   wherein at least one of said first and second substrate tables comprises a moveable bridge configured to form at least part of said bottom surface of said space in a plane of said top surface of the first or second substrate table and/or the substrate supported on said first or second substrate table and/or another object supported on said first or second substrate table; and
   wherein said first and second substrate tables are positionable relative to each other such that said moveable bridge substantially extends between said first and second substrate tables and can define at least part of said bottom surface.

18. A lithographic apparatus comprising:
   a first and a second table that are each positionable under a projection system;
   a liquid supply system configured to provide a liquid between said projection system and one of said first and second tables and/or an object on said one of said first and second tables,
   wherein at least one of said first and second tables has a retractable bridge which, in a use position, has a top surface which is substantially in a same plane as a top surface of said first and second tables and which, in plan, protrudes at least as far as any other part of said at least one of said first and second tables such that said first and second tables are moved together under said projection system with surfaces close enough together so as to substantially prevent leaking of liquid from said liquid supply system between said first and second tables.

19. The lithographic apparatus of claim 18, wherein in a retracted state, said retractable bridge of said one of said first and second substrate tables does not, in plan, extend, when still attached to said one of said first and second substrate tables, into any area into which said other one of said first and second substrate tables is configured to move.

20. A lithographic apparatus comprising:
   a substrate table configured to support a substrate;
   a protection system that defines a protection zone around said substrate table into which at least another object cannot enter;
   wherein said substrate table comprises a main portion and a moveable edge portion, wherein when the edge portion is in a first position, said moveable edge portion has a top surface which is substantially in a same plane as a top surface of said substrate table main portion, and presents, in plan, an outer edge that projects out of said protection zone, said moveable edge portion being moveable relative to the substrate table main portion to a second position in which said moveable edge portion does not project out of said protection zone.

21. The lithographic apparatus of claim 20, wherein said at least one other object is an additional substrate table.

22. The lithographic apparatus of claim 20, wherein said moveable edge portion is hingeably rotatable about an hinge from said first position to a retracted position in which said moveable edge portion does not protrude, in plan, from said protection zone.

23. The lithographic apparatus of claim 20, wherein said moveable edge portion is slidably attached to said substrate table and translatable from said first position to a retracted position in which said moveable edge portion does not protrude, in plan, from said protection zone.

24. The lithographic apparatus of claim 20, wherein said moveable edge portion is attached to said substrate table via a sacrificial weakness which is breakable at relatively low force.

25. The lithographic apparatus of claim 20, wherein said moveable edge portion is passive and is moveable by application of externally applied forces.

26. The lithographic apparatus of claim 20, wherein said substrate table further comprises an actuator to move said moveable edge portion from said first position to a retracted position in which said moveable edge portion does not protrude, in plan, from said protection zone.

27. The lithographic apparatus of claim 20, wherein said actuator is an electromagnetic or a spring actuator.

28. The lithographic apparatus of claim 20, further comprising a detector configured to (a) detect imminent collision of said moveable edge portion with an object and (b) send control signals to said actuator to move said edge portion to said retracted position.

29. The lithographic apparatus of claim 20, wherein a liquid proof sticker is positioned over a gap between said top surface of said moveable edge portion and said top surface of said substrate table main portion.

30. The lithographic apparatus of claim 20, wherein a liquid remover is provided on said substrate table to remove any liquid which drips off an end of said edge portion distal from said substrate table.

31. The lithographic apparatus of claim 20, wherein a liquid remover is provided at an end of said edge portion distal from said substrate table.

32. The lithographic apparatus of claim 20, wherein said liquid remover includes a drain positioned underneath an outer edge of the top surface of said edge portion.

33. The lithographic apparatus of claim 20, further comprising an additional substrate table configured to support a substrate wherein said additional substrate table comprises a main portion and a moveable edge portion, wherein when the moveable edge portion of said additional substrate table is in a first position, said moveable edge portion exposes a top surface which is substantially in a same plane as a top surface of said additional substrate table main portion and presents, in plan, an outer edge of said additional substrate table, said moveable edge portion of said additional substrate table being moveable relative to the additional substrate table.

34. The lithographic apparatus of claim 20, wherein said substrate table is positioned by a positioning device and said protection system is at least partly comprised of a mechanical bumper fixed to said positioning device.

35. A device manufacturing method, comprising:
providing a liquid to a space through which a patterned beam is projected, a first substrate table and/or an object supported by said first substrate table forming a part of a boundary of said space;
sealing the liquid in the space with a seal, the seal acting between the substrate and/or said object, and another object;
providing a second substrate table, at least one of said first and second substrate tables having a moveable bridge portion deployed in a use position, and moving said first and/or second substrate table(s) such that said bridge portion extends between said first and second substrate tables;
moving said first and second substrate tables together under said space such that first said bridge portion forms a part of the boundary of said space and then said second substrate table and/or an object supported by said second substrate table forms a part of the boundary; and
projecting the patterned beam of radiation through the liquid onto the object supported by said second substrate table.

36. The method of claim 35, wherein the first and second substrate tables have a moveable bridge portion and wherein, during said moving, the bridge portion of said first substrate table and, subsequently, the bridge portion of said second substrate table form a part of the boundary of said space.

37. A lithographic apparatus comprising:
a radiation system configured to condition a beam of radiation;
a patterning device support configured to support a patterning device, the patterning device configured to pattern the beam of radiation;
a substrate table configured to support a substrate; and
a projection system configured to project the patterned beam of radiation onto the substrate;
wherein said substrate table includes a support surface that supports said substrate and a moveable edge portion, said moveable edge portion being arranged on an outer edge of said substrate table and moveable between a first position, in which, a top surface of said moveable edge portion is substantially in a same plane as the support surface of said substrate table, and a second position in which the top surface of said moveable edge portion is substantially perpendicular to said support surface.

38. The apparatus of claim 37, wherein, in said first position, said top surface of said moveable edge portion defines an extension of said support surface.

* * * * *